United States Patent [19]
Hayashida et al.

[11] Patent Number: 5,444,753
[45] Date of Patent: Aug. 22, 1995

[54] X-RAY LITHOGRAPHY MASK, LIGHT EXPOSURE APPARATUS AND PROCESS THEREFORE

[75] Inventors: Masami Hayashida, Atsugi; Yutaka Watanabe, Isehara, both of Japan

[73] Assignee: Canon Kabushiki Kaisha, Tokyo, Japan

[21] Appl. No.: 203,752

[22] Filed: Mar. 1, 1994

Related U.S. Application Data

[63] Continuation of Ser. No. 850,588, Mar. 13, 1992.

[30] Foreign Application Priority Data

Mar. 18, 1991 [JP] Japan .................................. 3-077201

[51] Int. Cl.$^6$ ............................................. G21K 5/00
[52] U.S. Cl. ...................................... 378/35; 378/34
[58] Field of Search .................................... 378/34, 35

[56] References Cited

U.S. PATENT DOCUMENTS

| | | | |
|---|---|---|---|
| 4,500,615 | 2/1985 | Iwai | 430/30 |
| 4,831,640 | 5/1989 | Buckley | 378/34 |
| 5,005,075 | 4/1991 | Kobayashi et al. | 378/35 |
| 5,012,500 | 4/1991 | Watanabe et al. | 378/35 |
| 5,052,033 | 9/1991 | Ikeda et al. | 378/35 |
| 5,157,700 | 10/1992 | Kurosawa | 378/34 |

FOREIGN PATENT DOCUMENTS 0359370  3/1990  European Pat. Off. .

OTHER PUBLICATIONS

Patent Abstracts of Japan, Kokai No. 62-145625, vol. 11, No. 376, Jun. 1987.
Patent Abstracts of Japan, Kokai No. 63-009931, vol. 12, No. 25, Jan. 1988.
Patent Abstracts of Japan, Kokai No. 02-234498, vol. 14, No. 550, Sep. 1990.

*Primary Examiner*—Craig E. Church
*Attorney, Agent, or Firm*—Fitzpatrick, Cella, Harper & Scinto

[57] ABSTRACT

Disclosed are an X-ray lithography mask, an exposure apparatus and an exposure process such as an X-ray lithography exposure apparatus and an X-ray lithography exposure process. An X-ray lithography mask includes an X-ray transmission membrane, a transfer pattern depicted on the X-ray transmission membrane and a frame for supporting the X-ray transmission membrane. The transfer pattern is depicted on the basis of a changing direction of a film thickness profile of the X-ray transmission membrane. In the exposure apparatus and process, a changing direction of an intensity profile of a radiation light illuminated on an exposure area of a mask is coincident with a changing direction of a film thickness profile of a light transmission membrane on the mask and an illumination time of the radiation light for the exposure area is changed on the basis of the intensity profile of the radiation light and the thickness profile of the light transmission membrane so that the intensity of a transfer patter image formed by the transmission of the radiation light through the light transmission membrane is rendered uniform.

17 Claims, 8 Drawing Sheets

X-RAY LITHOGRAPHY MASK, LIGHT EXPOSURE APPARATUS AND PROCESS THEREFORE

This application is a continuation of prior application, U.S. Ser. No. 07/850,588 filed, Mar. 13, 1992.

BACKGROUND OF THE INVENTION

1. Field of the Invention

The present invention relates to an X-ray lithography mask, a light exposure apparatus and a light exposure process such as an X-ray lithography exposure apparatus and an X-ray lithography exposure process.

2. Related Background Art

In a conventional X-ray lithography exposure apparatus, after synchrotron radiation light emitted from an X-ray lithography light source is reflected by an optical system including a mirror apparatus, the light is guided into a sealed exposure chamber through an X-ray filter made of a material such as beryllium (Be) and illuminates an X-ray lithography mask (referred to as an X-ray mask hereinafter) arranged in the exposure chamber to transfer a mask pattern formed on an X-ray transmission membrane of the X-ray mask onto a wafer.

The synchrotron radiation light is radiated in the shape of an unfolded fan from the X-ray lithography light source. The light diverges in a circular orbital plane (a horizontal plane) while this light is parallel in a plane perpendicular to the circular orbital plane (a perpendicular plane). Further, the synchrotron radiation light has a roughly uniform intensity profile in the circular orbital plane.

Therefore, the following exposure systems have been adopted for uniformly illuminating an exposure area with a synchrotron radiation light.

(1) Mirror vibration system (a plane mirror)

A plane mirror is disposed parallel to the orbital plane of radiation light, and the mirror is vibrated so that the light having a uniform intensity profile in the orbital plane or a plane parallel to the mirror is scanned in a direction perpendicular to the orbital plane to illuminate an X-ray mask. The control of an exposure amount on the X-ray mask is performed by controlling the vibration speed of the plane mirror.

(2) Mirror vibration system (a curved mirror)

Radiation light is condensed and then collimated using two curved mirrors. The second mirror is vibrated similar to the above system (1) to scan the radiation light over an exposure area on an X-ray mask. The control of an exposure amount is also performed by controlling the vibration speed of the second mirror similarly.

(3) Electron beam rocking system

Electrons are rocked in a sinusoidal function manner at an emission point in an accumulating ring of an X-ray lithography light source so that radiation light has a uniform intensity profile in a direction perpendicular to an orbital plane as well as in the orbital plane. Although an entire exposure area can be exposed at a shot without any intensity irregularity or unevenness if the light is caused to be incident on an X-ray mask as it is without using an optical system, a mirror has been used in recent years in order to eliminate adverse influences of short wavelength components of the radiation light. As a result, the radiation light incident on the X-ray mask has a uniform intensity profile in a direction parallel to a reflection surface of the mirror while the radiation light is uneven in a direction perpendicular to the reflection surface. Therefore, the exposure amount is changed in the direction perpendicular to the reflection surface of the mirror to uniformly expose the entire X-ray mask.

(4) Mask-wafer stage scanning system.

Radiation light is reflected by a stationary plane mirror horizontally disposed parallel to an orbital plane. Since a reflected light has uniform intensity profile in a plane parallel to the orbital plane or a mirror reflection surface, a mask-wafer stage is scanned in a direction perpendicular to this plane. The control of the exposure amount is performed by controlling the moving speed of the mask-wafer stage.

(5) Stationary convex mirror system

A cylindrical curved mirror is arranged in a direction parallel to an orbital plane of radiation light, and the radiation light is diverged in a direction perpendicular to the orbital plane while being reflected as it is in a direction parallel thereto. Since the light incident on an X-ray mask has a uniform intensity profile in the orbital plane of the radiation light, a shutter having an opening extending parallel to the orbital plane is arranged and moved in that perpendicular direction. As a result, the exposure amount is controlled by the moving speed of the shutter.

These systems are common in the following point. While the light incident on the X-ray mask and the wafer is substantially uniform in the plane parallel to the mirror reflection surface, the light has an uneven intensity profile in the direction perpendicular to the mirror reflection surface. Therefore, a mirror, shutter or mask-wafer stage is moved, and the control of the exposure amount in the direction perpendicular to the mirror reflection surface is performed by adjusting its moving speed. Thus, the entire exposure area is uniformly illuminated.

The X-ray mask supports an X-ray transmission membrane or film by a supporting frame, and the transmission membrane transmits synchrotron radiation light of an exposure wavelength therethrough. Further, the membrane should be a strained self-sustained membrane having a good transmissivity to an alignment light (visible light, infrared light). In general, an inorganic or organic membrane having a thickness from 1 $\mu$m to 6 $\mu$m is used as such a membrane. The organic membrane, however, is disadvantageous in X-ray resistance, dimensional stability and the like, and therefore, the inorganic membrane is presently being dominant.

Boron nitride, silicon, silicon nitride, silicon carbide, etc., are mainly known as inorganic materials of such an X-ray transmission membrane. Among them, silicon nitride is most widely used since appropriate values of X-ray, visible and infrared light transmission factors, strength, strain characteristic, X-ray resistance and the like can be obtained and its stable manufacturing is possible.

The X-ray transmission membrane of inorganic material is produced as follows: In general, a membrane of a desired material consisting of a single layer or multi-layers is formed on a substrate of silicon or tile like by a vapor deposition method, etc., and thereafter a structure of an X-ray absorber or the like is formed thereon when necessary. The substrate in an area for transmitting synchrotron radiation light therethrough is then chemically removed from the substrate bottom. At this time, the control of internal stress at the time of a membrane fabrication by the vapor deposition method is important in order to make a strained self,sustained X-ray transmission membrane and to obtain an X-ray mask having a high dimensional stability. Therefore, chemical vapor deposition (CVD) is frequently used to form the membrane because the CVD is capable of largely changing the stress by altering its fabrication condition.

In the CVD, a volatile chemical compound for making -the membrane is vaporized and fed into a reaction chamber as a reactive gas and a chemical reaction is conducted on the substrate in the reaction chamber using heat, plasma, light or the like so that a thin film is formed on the substrate. The CVD is classified into low pressure chemical vapor deposition and atmospheric pressure chemical vapor deposition depending on the pressure in the reaction chamber.

In connection with an X-ray transmission membrane of the X-ray mask, its thin film or membrane forming mechanism is deeply related to diffusion of a reactive gas onto the substrate surface. Therefore, a roughly one-dimensional film thickness irregularity (a flow pattern) is likely to appear in the formed membrane along a diffusion direction of the reactive gas or a direction in which the reactive gas flows. In the low pressure CVD, the film thickness irregularity is considerably reduced since a mean free path of the reactive gas and its diffusion coefficient are relatively large. Still, the film thickness irregularity on one wafer in the low pressure CVD amounts to about 2 to 3%. In the atmospheric pressure CVD, this unevenness amounts to about 5 to 6%.

Further, a sputtering deposition method, an EB (electron beam) deposition method, a vacuum evaporation method and the like other than the CVD can be used, but film thickness irregularity occurs in these film fabrication methods. This irregularity often becomes a nearly one-dimensional one similar to the above, due to a geometrical disposition-between an evaporation source and a substrate.

In the X-ray lithography apparatus, the intensity profile of radiation light is likely to be deviated from an ideal profile due to undesirable characteristics of various optical elements as well as the above-discussed properties of the synchrotron radiation light and the optical system. As a result, its unevenness occurs.

Conventionally, the ideal intensity profile has been corrected by various exposure systems in order to uniformly illuminate the exposure area as discussed above. However, the irregularity deviated from the ideal intensity profile was not corrected. Thus, the irregularity of the exposure amount occurs on the wafer.

Reflection factor irregularity and profile error of an optical system mirror, film thickness irregularity of an X-ray filter, posture setting error, adhesion of contaminants to an optical element, etc., can be enumerated as reasons for causing the exposure amount irregularity. The film thickness irregularity of the X-ray transmission membrane is also a reason for a large irregularity of an exposure amount. Conventionally, only an effort to increase accuracies of various optical elements and systems has exclusively been made in order to reduce the exposure amount or light irregularity.

The exposure amount irregularity in the X-ray lithography appears as a line width error of a transfer pattern as mentioned above. For example, it is reported that a tolerance of the exposure amount fluctuation should be within $\pm 20\%$ when a gate layer pattern of 0.2 $\mu$m is to be formed, in order to restrain the fluctuation of the transfer pattern width of the gate layer pattern within $\pm 10\%$ (see K. Deguchi et. al. NTT R&D 39 601 (1990)). Actually, the line width error needs to be limited within $\pm 2.5\%$, and the exposure amount irregularity should be restricted within 5% (this is a maximum tolerance range) since reasons for the line width error involve dimensional errors and the like at the time of an X-ray mask fabrication other than the exposure amount irregularity.

The exposure light irregularity of about 2% is caused from the above-discussed reflection factor irregularity and profile error of the optical system mirror, while that of about 1% results from the film thickness irregularity of the X-ray filter. Considering other exposure amount irregularities, it is desirable that the exposure amount irregularity due to the film thickness irregularity of-the X-ray transmission membrane should be within 1%.

The magnitude of the film thickness irregularity that causes the exposure light irregularity of 1% differs depending on the material of the X-ray transmission membrane and the wavelength of the used x-ray used. For example, in a case when the synchrotron radiation light is reflected by a silicon carbide mirror and the light having a center wavelength of 1 $\mu$m obtained after being passed through a beryllium filter is used, the film thickness irregularity that causes the exposure light irregularity of 1% for the X-ray transmission membrane of silicon nitride having a film thickness of 2 $\mu$m is about 34 nm. This value corresponds to 1.7% of the film thickness.

Therefore, the film thickness irregularity of the X-ray transmission membrane should be below 34 nm (1.7%) in such a system in order to make the exposure light irregularity due to the film thickness irregularity of the X-ray transmission membrane smaller than 1%.

In the membrane fabricated by the above-discussed CVD, however, the film thickness irregularity of at least more than 2 to 3% occurs. Thus, this results in the exposure light irregularity of more than 1% due to the film thickness irregularity.

In the conventional X-ray lithography exposure apparatus, however, there is not provided any means for correcting the exposure light irregularity due to the film thickness irregularity.

SUMMARY OF THE INVENTION

An object of the present invention is to provide an X-ray lithography mask, a light exposure apparatus such as an X-ray lithography exposure apparatus and a process therefor which make it possible to realize an accurate exposure by correcting the intensity of radiation light such as synchrotron radiation light illuminated on a mask such as an X-ray lithography mask based on the film thickness profile of the mask or the X-ray lithography mask.

According to one aspect of an X-ray lithography mask of the present invention, an X-ray lithography mask comprises an X-ray transmission membrane, a transfer pattern depicted on the X-ray transmission membrane and a frame for supporting the X-ray transmission membrane. The transfer pattern is depicted on the basis of a changing direction of a film thickness profile of the X-ray transmission membrane.

According to one aspect of an exposure apparatus of the present invention, an exposure apparatus comprises a radiation source for radiating a radiation light, holder for holding a mask, an illumination optical system for illuminating an exposure area of a light transmission membrane on the mask with the radiation light and a correction device for changing an illumination time of the radiation light for the exposure area with respect to a changing direction of an intensity profile of the radiation light on the basis of the intensity profile of the radiation light and a film thickness profile of the light transmission membrane. The holder is capable of holding the mask in such a manner that the changing direction of the film thickness profile of the light transmission membrane on the mask is coincident with the changing direction of the intensity profile of the radiation light. In the following description of embodiments, since the structure of the holder is self-explanatory, the holder is omitted in the drawings.

According to one aspect of an exposure process of the present invention, an exposure process comprises the steps of: depicting a transfer pattern on a light transmission membrane of a mask on the basis of a changing direction of a film thickness profile of the light transmission membrane, holding the mask, illuminating an exposure area of the light transmission membrane with radiation light under a condition under which the changing direction of the film thickness profile of the light transmission membrane on the mask is coincident with a changing direction of an intensity profile of the radiation light and changing an illumination time of the radiation light for the exposure area with respect to the changing direction of the intensity profile of the radiation light on the basis of the intensity profile of the radiation light and the film thickness profile of the light transmission membrane.

According to one aspect of an X-ray lithography exposure apparatus of the present invention, an exposure apparatus comprises a synchrotron radiation source for radiating synchrotron radiation light and a holder for holding an X-ray lithography mask. The holder is capable of holding the X-ray lithography mask in such a manner that a changing direction of a film thickness profile of an X-ray transmission membrane on the X-ray lithography mask is coincident with a changing direction of an intensity profile of the synchrotron radiation light. Further, there are provided an illumination optical system for illuminating an exposure area of the X-ray transmission membrane with the synchrotron radiation light and a correction device for changing an illumination time of the synchrotron radiation light for the exposure area with respect to the changing direction of the intensity profile of the synchrotron radiation light on the basis of the intensity profile of the synchrotron radiation light and the film thickness profile of the X-ray transmission membrane.

According to one aspect of an X-ray lithography exposure process of the present invention, an exposure process comprises the steps of: depicting a transfer pattern on an X-ray transmission membrane of an X-ray lithography mask on the basis of a changing direction of a film thickness profile of the X-ray transmission membrane, holding the X-ray lithography mask, illuminating an exposure area of the X-ray transmission membrane with synchrotron radiation light under a condition under which the changing direction of the film thickness profile of the X-ray transmission membrane on the X-ray lithography mask is coincident with a changing direction of an intensity profile of the synchrotron radiation light and changing an illumination time of the synchrotron radiation light for the exposure area with respect to the changing direction of the intensity profile of the synchrotron radiation light on the basis of the intensity profile of the synchrotron radiation light and the film thickness profile of the X-ray transmission membrane.

These advantages and others will be more readily understood in connection with the follow detailed description, claims and drawings.

DETAILED DESCRIPTION OF THE PREFERRED EMBODIMENT

Figure 1:
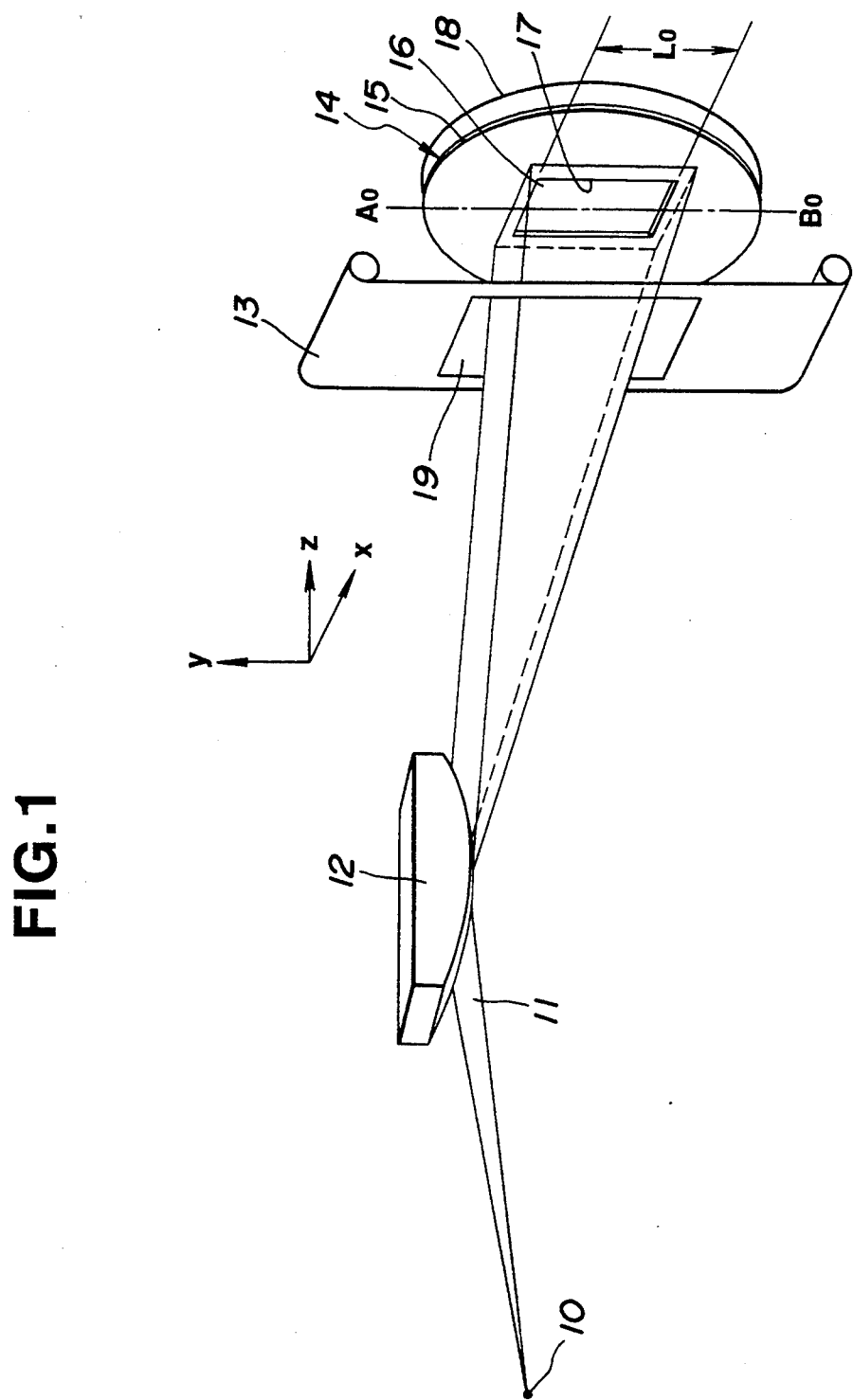
FIG. 1 is a perspective view showing the structure of a first embodiment of an X-ray lithography exposure apparatus.

FIG. 1 shows a first embodiment of an X-ray lithography exposure apparatus according to the present invention. In the X-ray lithography exposure apparatus of this embodiment, a synchrotron radiation light (referred to as a radiation light hereinafter) 11 radiated from an emission light source 10 is expanded by a stationary convex mirror 12 in a direction (a y-axis direction) perpendicular to an orbital plane of the radiation light 11 to have a sufficient size so as to illuminate an entire area of an exposure area to. Thus, the radiation light 11 is illuminated onto an X-ray mask 14, and a mask pattern formed on an X-ray transmission membrane 16 of the X-ray mask 14 is projected onto a silicon wafer 18 coated with a resist. A shutter 13 is arranged for correcting an exposure light irregularity or non-uniformity. The shutter 13, X-ray mask 14 and silicon wafer 18 are contained in a sealed exposure chamber (not shown). After the radiation light 11 is reflected by the stationary convex mirror 12, the radiation light 11 is guided to the X-ray mask 14 through an X-ray filter (not shown) of the exposure chamber.

Figure 2:
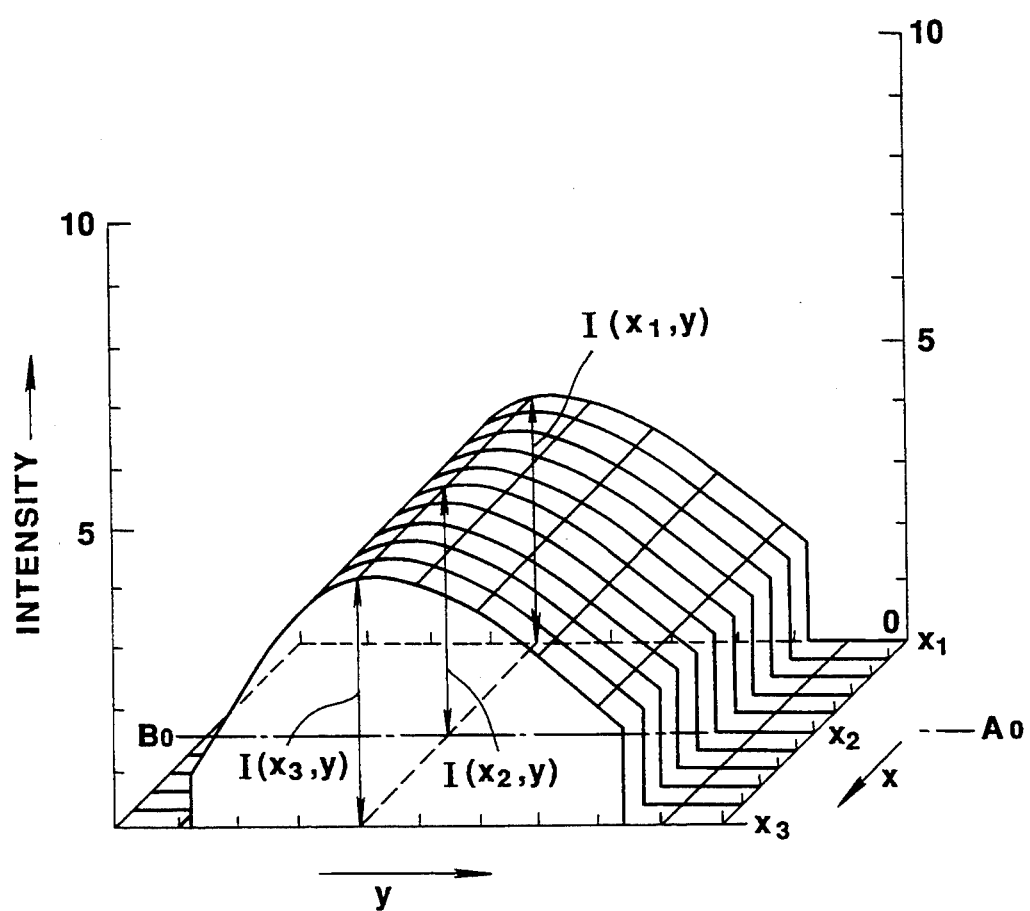
FIG. 2 is a graph showing an example of the intensity profile of a synchrotron radiation light illuminated on an X-ray transmission membrane of an X-ray mask.

As to the intensity profile of the radiation light 11 illuminated on the X-ray mask 214, its central portion in the y-direction shows a maximum value as shown in FIG. 2, and the intensity on the X-ray mask 14 along an x-axis direction orthogonal to the y-axis direction is nearly constant at the same y-coordinate.

The intensity I (x, y) at respective coordinates of the radiation light 11 on the X-ray mask 14 shown in an x-y coordinate system of FIG. 2 is represented by:

I $(x_1, y) = I (x_2, y) = I (x_3, y)$ where x-coordinates at both opposite ends in the x-axis direction on an illuminated area of the X-ray mask 14 with the radiation light 11 are $x_1$ and $x_3$, respectively, and the x-coordinate at its central point is $x_2$.

Thus, the intensity distribution or profile in the x-axis direction is uniform, but that in the y-axis direction is uneven. Therefore, the illumination amount of the radiation light 11 on the. X-ray mask 14 is controlled by the shutter 13 arranged at the stationary convex mirror side of the X-ray mask 14 in order to correct the intensity profile in the y-axis direction. In the shutter 13, an opening 19 is formed for passing therethrough the radiation light 11 reflected by the stationary convex mirror 12. The opening 19 is scanned in the y-axis direction and its moving speed is changed so that the illumination amount of the radiation light 11 on the X-ray mask 14 is controlled.

The shutter 13 in this embodiment is moved in a y-direction (from above to below) of FIG. 3. The amount of exposure light or exposure light amount at respective portions in the y-direction is determined by a product of an illumination time $\Delta t$ (y) from the opening of the shutter 13 by a front shutter 20 of its opening 19 to the closing thereof by a rear shutter 21 of its opening 19 and the intensity I (x, y) of the radiation light 11 at the respective portions. Therefore, the illumination time $\Delta t$ (y) is set in accordance with the magnitude of the intensity I (x, y) of tile radiation light 11 on the X-ray mask 14 so that the intensity of the mask pattern on the X-ray mask 14 projected onto the silicon wafer 18 is rendered uniform.

Figure 3:
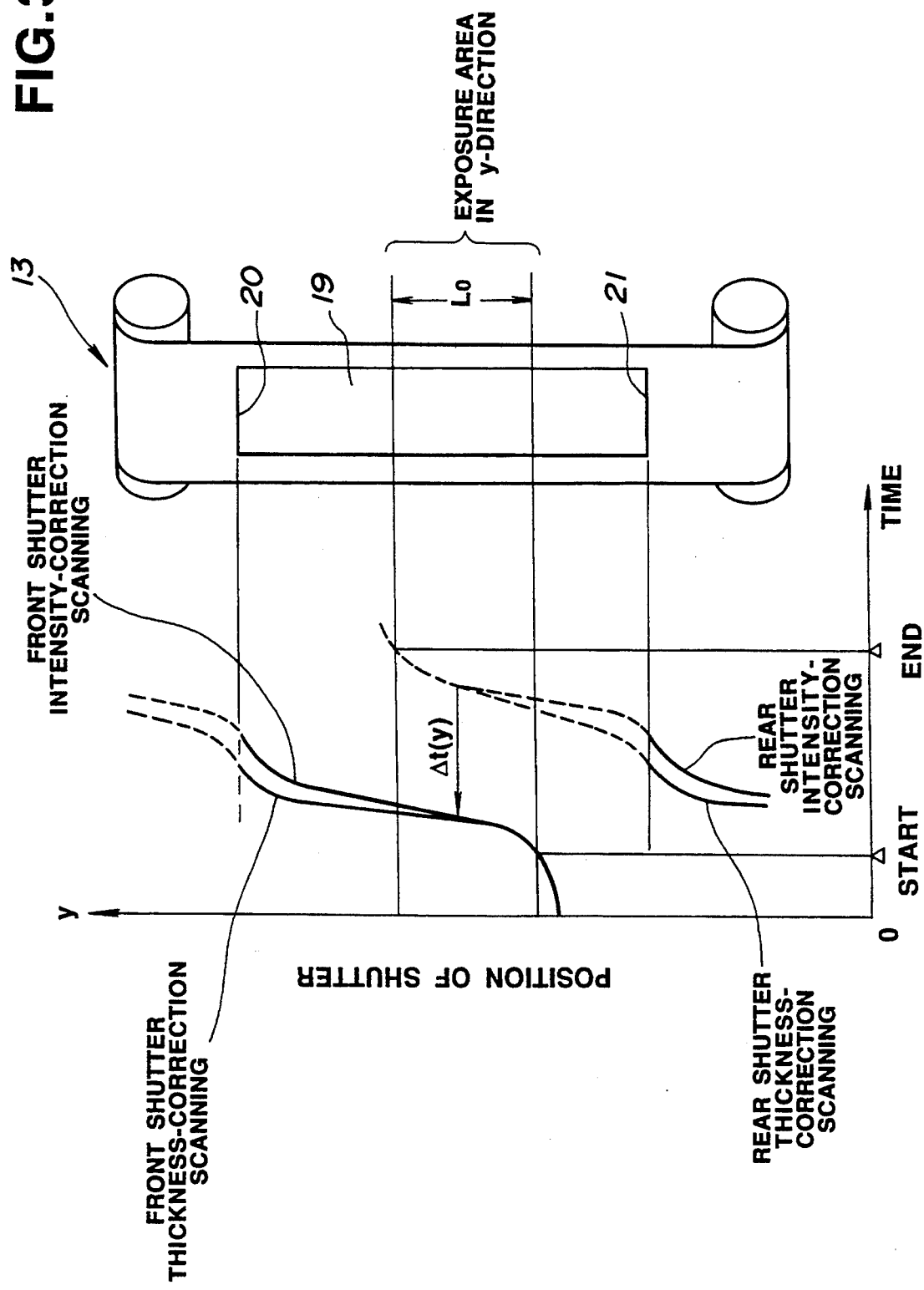
FIG. 3 is an illustration showing the structure of a shutter which functions as a correcting means and an operation example of the shutter.

In this embodiment, as shown by front and rear shutter intensity-correction scannings in FIG. 3, the illumination time is controlled according to the intensity profile of the radiation light 11 by setting the moving amount of the shutter 13 for a time t. In actuality, since the rear shutter 21 follows the front shutter 20, such moving amount is set solely for the front shutter 20.

Thus, if the intensity profile of the radiation light 11 illuminated on the X-ray mask 14 is uniform in the x-axis direction, the shutter 13 is scanned in the y-axis direction as discussed above so that the radiation light 11 transmitted through the X-ray mask 14 can uniformly be illuminated on an exposure area of the wafer 18. In this embodiment, the exposure light irregularity caused by a film thickness profile of the K-ray mask 14 is suppressed within 1% in order to restrict an entire exposure light irregularity caused by the intensity profile of the radiation light 11 within 5% the value of which is within a tolerance range.

The X-ray mask 14 is composed of the X-ray transmission membrane 16 and a frame 15 for supporting the X-ray transmission membrane 16. An X-ray transmission window 17 is formed in the supporting frame 15.

Figure 4:
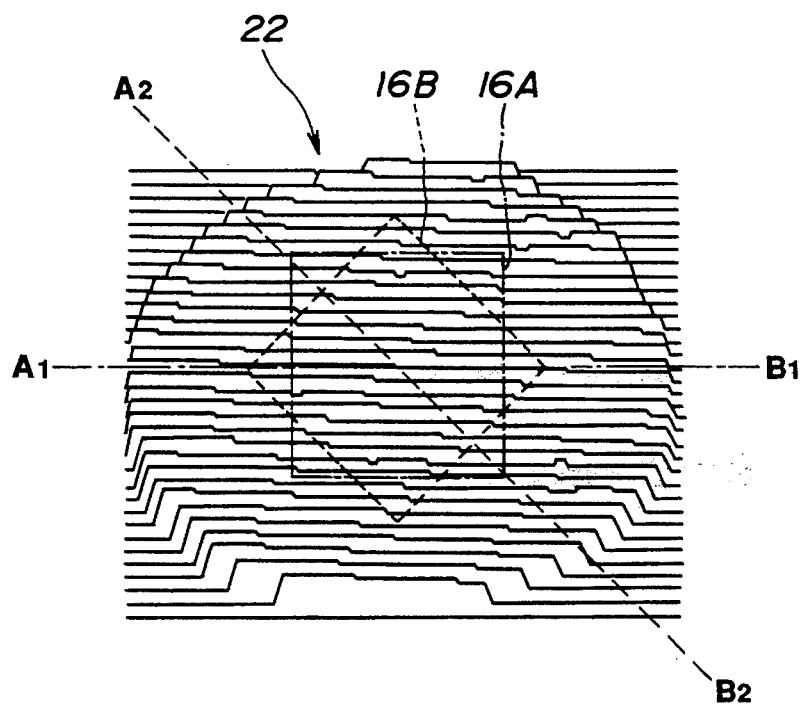
FIG. 4 is a view showing an example of the film thickness profile of a silicon nitride film for fabricating an X-ray transmission membrane.
Figure 5:
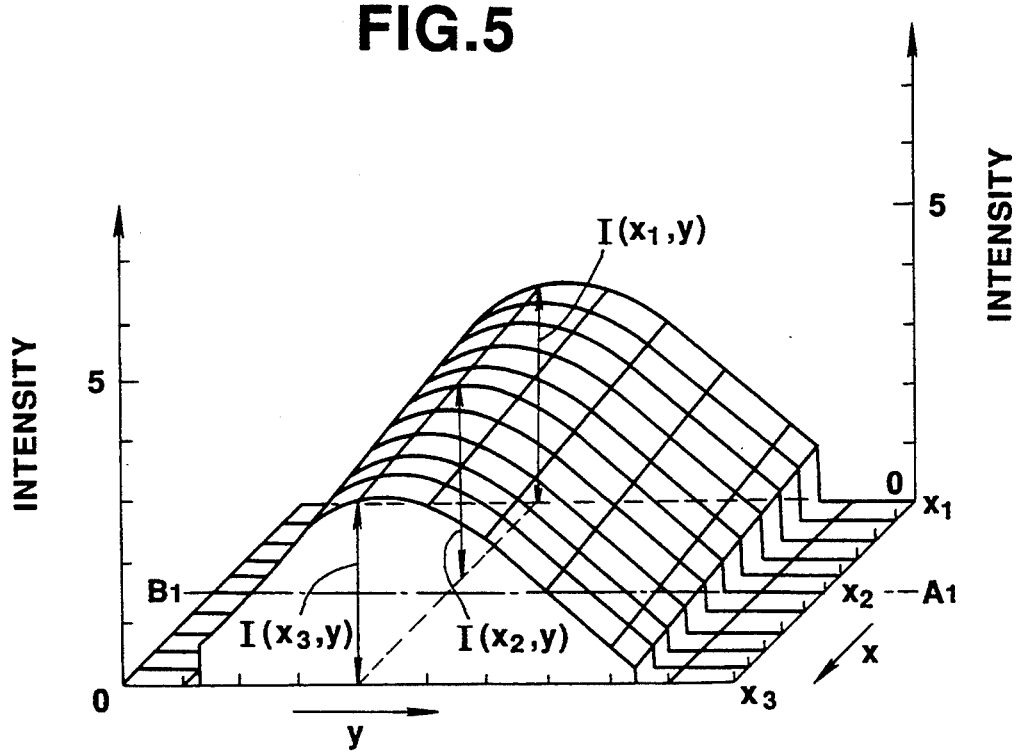
FIG. 5 is a graph showing an example of the intensity profile of a synchrotron radiation light transmitted through an X-ray transmission membrane.

The X-ray transmission membrane 15 is produced by the CVD and made of a silicon nitride film 22 having a thickness of 2 μm (see FIG. 4). The thickness irregularity or uniformity of the silicon nitride membrane 22 is measured before the fabrication of the X-ray mask 14 using a thickness measuring device of spectroscopic reflection-factor measuring type, and its result shows a film thickness profile as shown in FIG. 4. The thickness profile of the silicon nitride film 22 for forming-the X-ray transmission membrane 16 results in a factor for generating the exposure light irregularity after the transmission of the radiation light 11 through the X-ray transmission membrane 16. For example, a first X-ray transmission membrane 16A having a center line $A_1-B_1$ as shown in FIG. 4 (see dash and dotted lines therein) is considered, and the X-ray mask 14 is assumed to be fabricated using the first X-ray transmission membrane 16A with the line $A_1-B_1$ overlapping a line $A_o-B_o$ of the X-ray mask 14 shown in FIG. 1. The intensity profile I(x, y) of the radiation light 11 after being transmitted through the first X-ray transmission membrane 16A of the X-ray mask 14 is represented by:

I$(x_1, y) > I(x_2, y) \div (x_3, y)$ where the uniformity in the x-direction is lost as shown in FIG. 5.

For such an intensity profile, the exposure is performed by scanning the shutter 13 as indicated by the front and rear shutter intensity-correction scannings of FIG. 3. Then, when the exposure light irregularity at this time is measured, the result exhibits 4.2%. Even when the scanning speed of the shutter 13 is corrected so that an optimum exposure time is established, considering the film thickness profile of the first X-ray transmission membrane 16A, it turns out that the exposure light irregularity of 3.7% occurs. This exposure light irregularity is caused by the film thickness profile of the first X-ray transmission membrane 16A for the radiation light 11 illuminated on the X-ray mask 14 in the exposure chamber, i.e., the radiation light 11 after being transmitted through the X-ray filter. Actually, however, the intensity irregularity of the radiation light 11 is caused even by the stationary convex mirror 12 and the film thickness profile of the X-ray filter and the like through or by which the radiation light 11 transmits or is reflected before reaching the X-ray mask 14. Therefore, since the exposure light irregularity concerning such intensity irregularity (3 to 4%) is added, the actual entire exposure light irregularity amounts to about 7 to 8%. This value surpasses the above-mentioned tolerance.

The exposure light irregularity due to the film thickness proile of the first X-ray transmission membrane 16A is considered to occur because the intensity of the radiation light 11 transmitted through the first X-ray transmission membrane 16A along the x-direction is uneven for the scanning of the shutter 13 in the y-direction.

Figure 6:
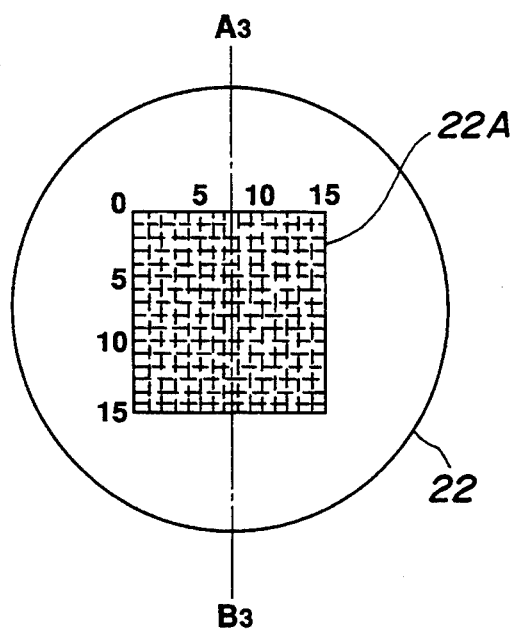
FIG. 6 is a view for explaining a method for fabricating an X-ray transmission membrane.

Therefore, in this embodiment, an optimum portion be used as the X-ray-transmission membrane 16 in which at least the intensity in the x-direction of the radiation light 11 is nearly uniform, is searched on the silicon nitride film 22, and the searched portion is used as the X-ray transmission membrane 16. An example of a method for searching this optimum portion is as follows: First, a virtual membrane 22A corresponding to the X-ray transmission membrane 16 with a line $A_3-B_3$ as a center line is considered on the silicon nitride film 22, as shown in FIG. 6. Then, the virtual membrane 22A is divided into 15 lines along the line $A_3-B_3$ and into 15 rows along a direction perpendicular thereto, and thicknesses at crossing points are measured. From the measured thicknesses, such a virtual membrane 22A in which the thickness profile along the direction of the line $A_3-B_3$ varies one-dimensionally is searched. In this case, average film thicknesses $T(y)$ are obtained per each line of the lines from the measured thicknesses at the crossing points, and the thickness profile in the direction of the line $A_3-B_3$ is investigated based on the average thicknesses $T(y)$. This operation is repeated each time the line $A_3-B_3$ of the silicon nitride film 22 is rotated by 5 degrees until 180 degrees. Thus, a portion in which the difference of the average thickness profile $T(y)$ is the largest is searched out of virtual membranes 22A having respective lines $A_3-B_3$.

Figure 7:
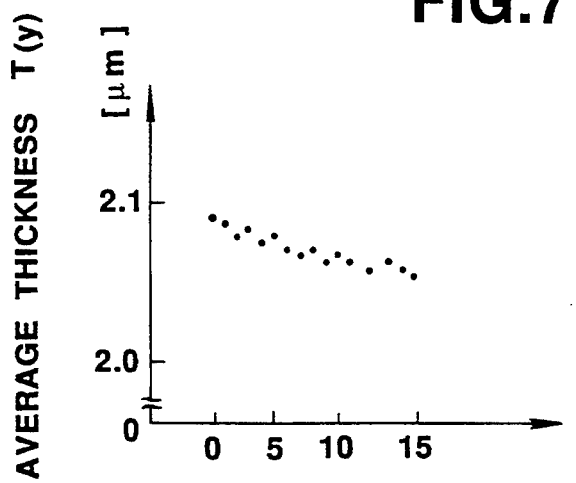
FIG. 7 is a graph showing a change of an average thickness of an K-ray transmission membrane.

In this embodiment, after the above-discussed operation is conducted, it is found that a second X-ray transmission membrane 16B (dotted lines) having a line $A_2-B_2$ as a center line as shown in FIG. 4 has the largest difference of the average film thickness profile $T(y)$ and a nearly linear variation in the direction of the line $A_2-B_2$, on the silicon nitride film 22. The distribution of the average thicknesses $T(y)$ per each line of the second X-ray transmission membrane 16B is illustrated in FIG. 7. This varies generally linearly in the direction of the line $A_2-B_2$ as shown in FIG. 7.

Figure 8:
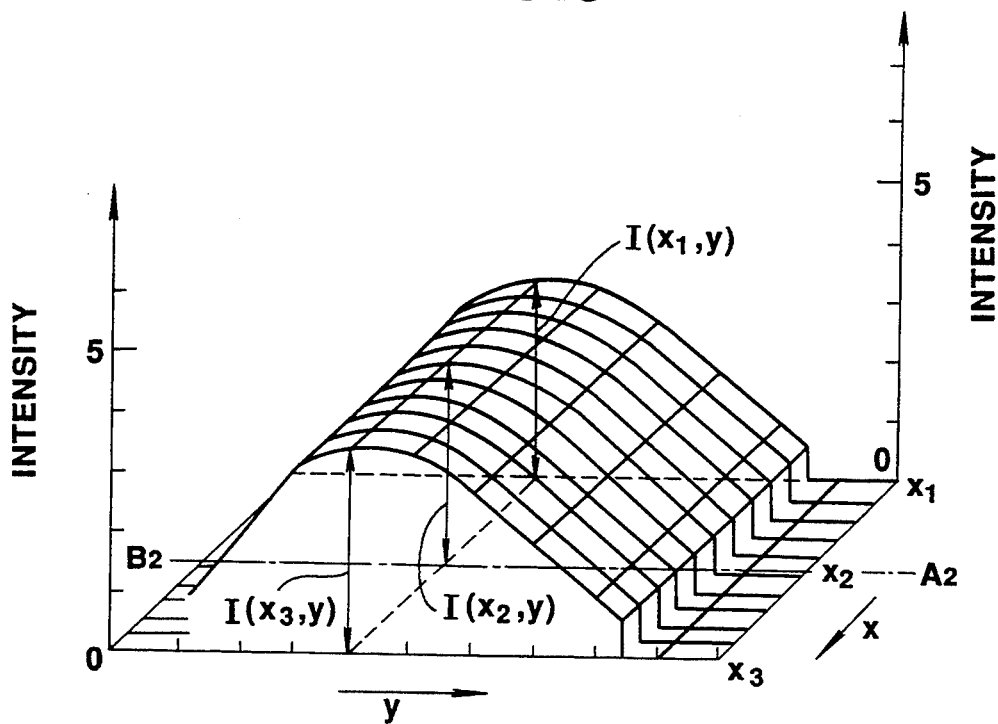
FIG. 8 is a graph showing another example of the intensity profile of a synchrotron radiation light transmitted through an X-ray transmission membrane.

Calculated values of the intensity profile of the radiation light 11 transmitted through the second X-ray transmission membrane 16B are indicated in FIG. 8.

The second X-ray transmission membrane 16B has a film thickness profile in which a portion at the $A_2$ side is thick and a portion at the $B_2$ side is thin as shown in FIG. 7. Therefore, in the intensity profile shown in FIG. 8, a maximum intensity part of the radiation light 11 transmitted through the second X-ray transmission membrane lab is shifted towards the $B_2$ side, but the intensity along the x-direction at the same y-coordinate is nearly uniform, as represented by:

$I(x_1, y) \div I(x_2, y) \div (x_3, y)$.

From such an intensity profile of the radiation light 11, an optimum scanning amount of the shutter 13 for the film thickness profile of the second X-ray transmission membrane 16B of the X-ray mask 14 is obtained. This result is indicated by front and rear shutter film-thickness-correction scannings shown in FIG. 3. In this case, the exposure light irregularity caused by the film thickness profile of the second X-ray transmission membrane 16B is estimated to be 0.7% by calculation.

Here, the X-ray mask 14 is formed using the second X-ray transmission membrane 16B with the line $A_2-B_2$ coincident with the line $A_0-B_0$ shown in FIG. 1, and an X-ray detector consisting of a photodiode is disposed at the position of the silicon wafer 18. Then, the intensity profile of the radiation light 11 corresponding to the exposure light irregularity which is supposed to be created by tile film thickness profile of the second X-ray transmission membrane 16B is measured. This value is about 0.8%, and generally equal to the calculated result. When the entire exposure light irregularity is obtained from this exposure light irregularity due to the film thickness profile of the second X-ray transmission membrane 16B, the result turns out to be 3.8 to 4.8%. This value fails within the tolerance mentioned above.

Thus, in the case when the film thickness profile of the X-ray mask 14 is nearly one-dimensional, it is seen that tile exposure light irregularity due to the film thickness irregularity can greatly be decreased by coinciding the direction of this film thickness profile with the moving direction of the shutter 13 and setting the moving speed of the shutter 13 considering the film thickness profile. In this embodiment, the X-ray transmission membrane formed by the CVD is used, but the X-ray transmission membrane may be formed by a sputtering method or other deposition methods.

Figure 9:
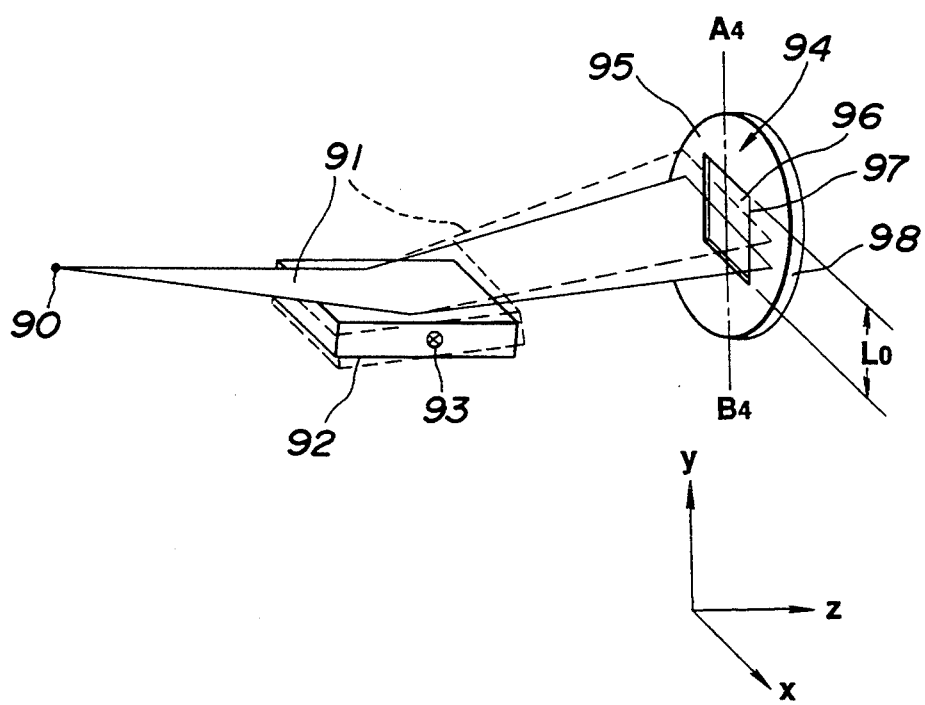
FIG. 9 is a perspective view showing the structure of a second embodiment of an K-ray lithography exposure apparatus.
Figure 10:
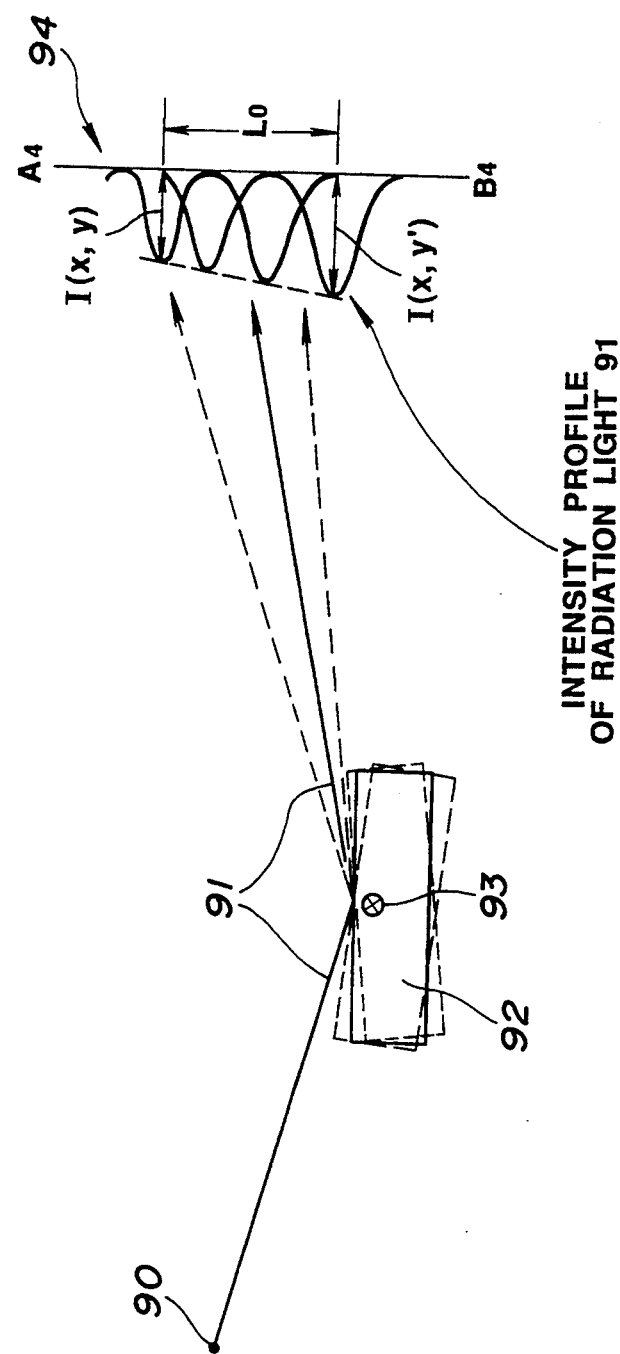
FIG. 10 is a side view showing the intensity profile of a synchrotron radiation light illuminated on an X-ray mask in the second embodiment.

FIG. 9 shows a second embodiment of an X-ray lithography exposure apparatus according to the present invention. In the X-ray lithography exposure apparatus of this embodiment, a synchrotron radiation light (referred to as a radiation light hereinafter) 91 radiated from an emission light source 90 is reflected by a plane mirror 92 and is illuminated to an X-ray mask 94. Thus, a mask pattern formed on an X-ray transmission membrane 96 of the X-ray mask 94 is projected onto a silicon wafer 98 coated with a resist. At this time, the plane mirror 92 is vibrated about a rotation axis 93 so that the radiation light 91 is illuminated on an entire exposure area Lo of the X-ray mask 94. By the vibration of the plane mirror 92, the radiation light 91 reflected by the plane mirror 92 is vibrated up and down in a direction (a y-direction) perpendicular to a mirror reflection surface as shown by dotted lines in FIG. 9, and is illuminated on the entire exposure area Lo. Since the reflection factor of the plane mirror 92 becomes higher as the incident angle of the radiation light 91 thereon is smaller, the intensity profile of the radiation light 91 after reflection is as indicated in FIG. 10.

The X-ray mask is composed of-the X-ray transmission membrane 96 and a supporting frame 95 for supporting the membrane 96. An X-ray transmission window is formed in the supporting frame 95.

When comparing a case when a maximum intensity value $I(x, y)$ of the radiation light 91 is at a position in the exposure area Lo nearest a side $A_4$ with a case when the maximum intensity value $I(x, y')$ thereof is at a position in the exposure area Lo nearest a side $B_4$, the reflection intensity of the latter is 1.2 times stronger than that of the former. Here, if the thickness of the X-ray transmission membrane 96 is uniform, an exposure time is determined considering the wavelength of the radiation light 91 at respective positions and the wavelength dependency of an X-ray absorption factor for the above thickness of the X-ray transmission membrane 96.

In the X-ray lithography exposure apparatus, the X-ray mask 94 is formed using the second X-ray transmission membrane 16B (see FIG. 4) similar to the first embodiment with the center line $A_2-B_2$ coincident with the line $A_4-B_4$ shown in FIG. 9, and the plane mirror 92 is vibrated under a mirror vibration condition in which the film thickness irregularity of the second X-ray transmission membrane 16B is not considered, i.e., in which only the reflection intensity profile of the radiation light 91 is considered. An X-ray detector consisting of a photodiode is arranged at a position where the silicon wafer 98 is to be disposed. Then, the intensity profile of the radiation light 91 corresponding to the entire exposure light irregularity is measured. This value is about 7.4%.

Similarly to the first embodiment, the average value profile (see FIG. 7) of the film thickness irregularity of the X-ray transmission membrane 16B is obtained, and the vibration condition of the plane mirror 92 is set so that the exposure light irregularity caused by such a film thickness profile can be compensated for by the exposure time. As a result, the exposure light irregularity is reduced to about 3.9%. Further, the exposure light irregularity is measured without the X-ray mask 94 being disposed. Hence, it is found that the exposure light irregularity of about 3.2% is caused by the plane mirror 92, an X-ray filter (not shown) and the like.

Therefore, it is seen that the exposure light irregularity due to the second X-ray transmission membrane 16B prior to the correction is 4.2% while that after the correction is 0.7%. This is the same result as that of the first embodiment.

Next, a line and space pattern having a minimum line width of 0.25 μm is formed with an absorber of gold (Au) on an X-ray transmission membrane having the film thickness profile similar to the above one. This is used as an X-ray mask 94, and the silicon wafer 98 coated with a resist is exposed. When the correction is performed by the plane mirror 92 for the film thickness profile, the line width error is about 12 nm (4.8%). On the other hand, when such correction for the film thickness profile is not performed, the line width error of about 20 nm (8%) occurs. Thus, it is seen that the line width error related to the exposure light irregularity caused by the film thickness profile can be considerably lowered by compensating for the film thickness profile of the X-ray transmission membrane by an appropriate vibration of the plane mirror 92. Even in a case when the film thickness profile of the X-ray transmission membrane does not exhibit a one-dimensional property, the exposure light irregularity can be corrected by an appropriate vibration manner of the plane mirror 92.

Figure 11:
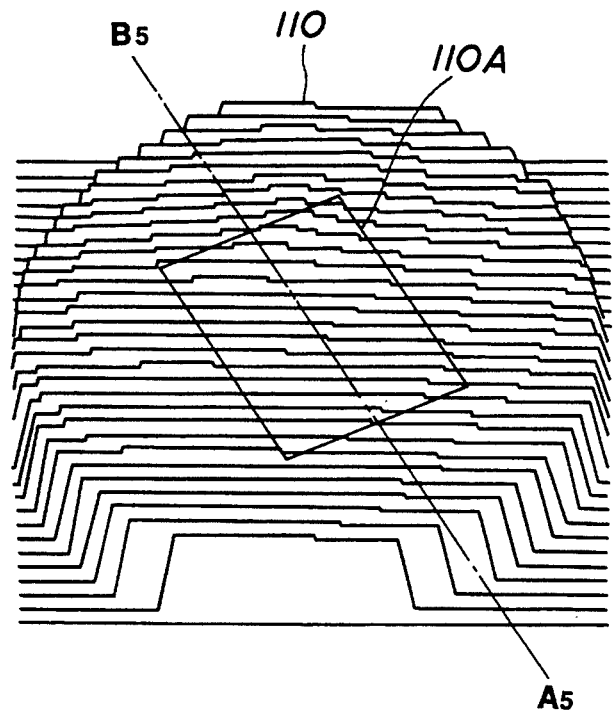
FIG. 11 is an illustration showing an example of the film thickness profile of an X-ray transmission membrane of the X-ray mask used in the second embodiment.
Figure 12:
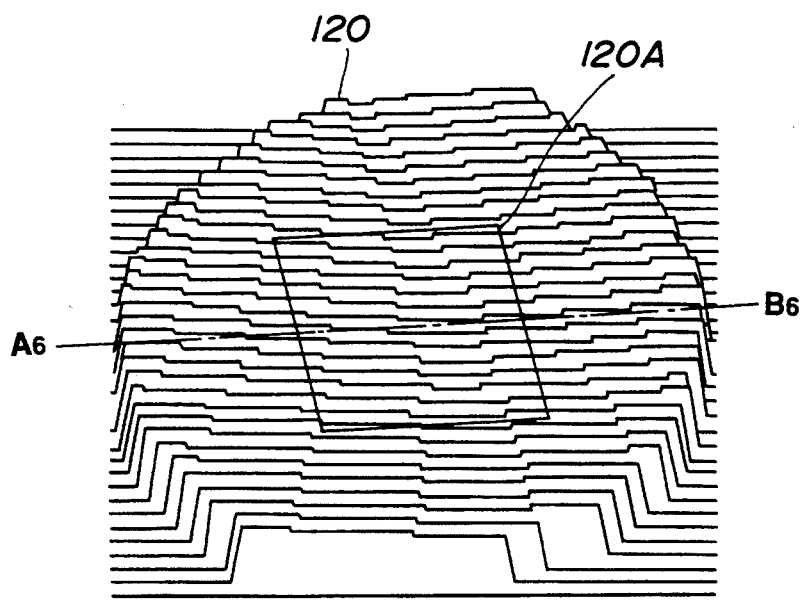
FIG. 12 is an illustration showing another example of the film-thickness profile of an X-ray transmission membrane of the K-ray mask used in the second embodiment.

For example, silicon nitride films 110 and 120 having film thickness profiles as shown in FIGS. 11 and 12 are considered, and their thickness profiles are measured.

In this case, for respective silicon nitride films 110 and 120, lines $A_5$–$B_5$ and $A_6$–$B_6$ extending through centers thereof are considered. Further, areas having a size of the X-ray transmission membrane 96 of the X-ray mask 94 shown in FIG. 9 with the lines $A_5$–$B_5$ and $A_6$–$B_6$ as a center line are considered. The areas, then, are respectively divided into 12 lines along the lines $A_5$–$B_5$ and $A_6$–$B_6$ and into 12 rows in a direction perpendicular thereto, and thicknesses of crossing points are measured. Averages of the thicknesses late obtained for 12 points in the respective lines. From the measured thicknesses, such directions of the lines $A_5$–$B_5$ and $A_6$–$B_6$ in which the difference between maximum and minimum values of 12 average thicknesses is the greatest are searched for the respective silicon nitride films 110 and 120. The lines $A_5$–$B_5$ and $A_6$–$B_6$ shown in FIGS. 11 and 12 are those directions in which the difference of the average thicknesses is maximum for respective silicon nitride films 110 and 120. Third and fourth X-ray transmission membranes 110A and 120A have areas corresponding to the size of the X-ray transmission window 97, respectively.

The third X-ray transmission membrane 110A is used, and its center line $A_5$–$B_5$ ia caused to be coincident with the line $A_4$–$B_4$ shown in FIG. 10. Thus, the X-ray mask 94 is formed and arranged. Considering the intensity profile of the radiation light 91 shown in FIG. 10, the vibration of the plane mirror 92 is controlled, and then the exposure light irregularity or uniformity is measured. The value turns out to be 7.0%. In a case when the vibration of the plane mirror 92 is controlled considering the film thickness profile of the third X-ray transmission membrane 110A as well as the intensity profile of the radiation light 91, the exposure light irregularity turns out to be 3.2%. Further, the X-ray mask 94 is similarly formed for the fourth X-ray transmission membrane 120A, and when solely the intensity profile of the radiation light 91 is considered, the exposure light irregularity shows a value of 4.9%. In a case when the vibration of the plane mirror 92 is controlled considering the film thickness profile of the fourth X-ray transmission membrane 120A as well as the intensity profile of the radiation light 91, the exposure light irregularity turns out to be 1.1%.

Thus, the exposure light uniformity can greatly be improved by scanning the radiation light 91 using the plane mirror 92 considering the reflection intensity of the radiation light 91 and the film thickness profile of the X-ray transmission membrane 96 of the X-ray mask 94. This is possible not only for the X-ray transmission membrane 96 in which its film thickness profile is linearly or one-dimensionally changed, but also for that having a two-dimensionally varying thickness profile.

When a plurality of X-ray masks for a multi-exposure are used for multi-time exposures in a process, directions of the film thickness profile of the X-ray transmission membrane and of the mask pattern thereon must be coincident with each other for all the masks to be used for respective exposures.

For example, when the third and fourth X-ray transmission membranes 110A and 120A shown in FIGS. 11 and 12 are used as the multi-exposure masks, the lines $A_5$–$B_5$ and $A_6$–$B_6$ should be coincident with each other, and the mask patterns should be coincident with these lines, respectively. If the X-ray masks were fabricated without considering this factor, the exposure light irregularity due to the film thickness profile of the X-ray transmission membrane of one of the X-ray masks could be corrected while the correction was impossible for the other one. In this case, the line width error of the mask pattern is determined from the exposure light irregularity of the X-ray transmission membrane which is not corrected, and therefore, the effect of reduction of the line width error due to the correction is small.

For example, when the correction is performed for the third X-ray transmission membrane 110A, the exposure light irregularity becomes 4.9% whose value is related to the fourth X-ray transmission membrane 120A. On the other hand, when the correction is conducted for the fourth X-ray transmission membrane 120A, the exposure light irregularity becomes 7.1% whose value is related to the third X-ray transmission membrane 110A. Therefore, in the case when the multi-exposure is performed using a plurality of X-ray masks, the respective X-ray masks should be fabricated so that directions of the thickness profile of the X-ray transmission membrane and of the mask pattern are coincident with each other and the correction for the thickness profile must be performed for all the masks in order to reduce the line width errors of the mask patterns.

In the above-discussed embodiments, the stationary convex mirror system and the mirror vibration system (a plane mirror) are adopted as an optical system. Other systems such as a mirror vibration system (a curved mirror), electron beam rocking system, mask-wafer stage scanning system and the like can also be used, and also in these cases, the exposure light irregularity can be suppressed similarly.

As explained in the foregoing, since the present invention is constructed as mentioned above, the following effects can be obtained.

The illumination time of the synchrotron radiation light on the exposure area of the X-ray lithography mask is altered considering both the intensity profile of the synchrotron radiation light and the film thickness profile of the X-ray transmission membrane of the X-ray lithography mask. This, the intensity of a transfer pattern image formed by the transmission of the synchrotron radiation light through the X-ray transmission membrane can be substantially uniform. As a result, the exposure light irregularity of the line width error and the like of the transfer pattern due to the intensity irregularity of the synchrotron radiation light can be reduced, and an accurate exposure becomes possible.

Further, even when the multi-exposure is conducted using a plurality of X-ray lithography masks, the exposure light irregularity per each X-ray lithography mask can be reduced. Thus, a high-precision exposure can be realized.

While the present invention has been described with respect to what is presently considered to be the preferred embodiment, it is understood that the invention is not limited to the disclosed embodiment. The present invention is intended to cover various modifications and equivalent arrangements included within the spirit and scope of the appended claims.

What is claimed is:

1. An exposure mask for transferring a pattern onto a substrate in a lithography process, said mask comprising:
   a base surface having optical non-uniformity along a predetermined direction; and
   a transfer pattern having a plurality of pattern lines in a predetermined arrangement, said pattern being depicted on said base surface with the plurality of pattern lines oriented in the predetermined direction.

2. An exposure mask according to claim 1, wherein said base surface and said transfer pattern comprise materials suitable for performing X-ray exposure.

3. An exposure mask according to claim 1, wherein said base surface comprises a transmission membrane.

4. An exposure mask according to claim 3, wherein a thickness of said transmission membrane varies along the predetermined direction.

5. An exposure method comprising the steps of:
   providing a mask having a transfer pattern formed on a transmission membrane, the transmission membrane having non-uniform transmission coefficients along a predetermined direction;
   illuminating the transfer pattern on the transmission membrane with an exposure beam for exposing the transfer pattern to transfer the transfer pattern onto a substrate; and
   correcting variations in intensity of the exposure beam along the predetermined direction to expose the substrate uniformly.

6. An exposure mask according to claim 5, wherein said illuminating step comprises illuminating the transfer pattern with X-rays in synchrotron radiation.

7. An exposure mask according to claim 5, wherein said providing step comprises providing a mask that includes a transmission membrane having a thickness that varies along the predetermined direction.

8. An exposure method according to claim 5, wherein said correcting step comprises moving a shutter to correct variations in the intensity of the exposure beam.

9. An exposure method according to claim 5, wherein said correcting step comprises scanning a mirror to correct variations in the intensity of the exposure beam.

10. An exposure method comprising the steps of:
    providing a mask having a transfer pattern formed on a transmission membrane, the transmission membrane having non-uniform transmission coefficients along a predetermined direction;
    generating an exposure beam having non-uniform beam intensity substantially in one dimension;
    positioning the mask relative to the exposure beam so that the predetermined direction of the mask is coincident with the direction of non-uniform beam intensity; and
    illuminating the transfer pattern on the transmission membrane with the exposure beam for exposing the transfer pattern to transfer the transfer pattern onto a substrate.

11. An exposure mask according to claim 10, wherein said generating step comprises generating X-rays in synchrotron radiation.

12. An exposure mask according to claim 10, wherein said providing step comprises providing a mask that includes a transmission membrane having a thickness that varies along the predetermined direction.

13. An exposure method according to claim 10, further comprising the step of correcting variations in the intensity of the exposure beam along the predetermined direction to expose the substrate uniformly.

14. An exposure apparatus comprising:
    means for holding a mask having a transfer pattern formed on a transmission membrane, the transmission membrane having non-uniform transmission coefficients along a predetermined direction;
    means for positioning the mask relative to an exposure beam and illuminating the transfer pattern on the transmission membrane of the mask with the exposure beam for exposing the transfer pattern to transfer the pattern onto a substrate; and
    means for correcting variations in intensity of the exposure beam along the predetermined direction to expose the substrate uniformly.

15. An exposure apparatus comprising:
    means for holding a mask having a transfer pattern formed on a transmission membrane, the transmission membrane having non-uniform transmission coefficients along a predetermined direction;
    means for generating an exposure beam having non-uniform beam intensity substantially in one dimension;
    means for positioning the mask relative to the exposure beam so that the predetermined direction of the mask is coincident with the direction of non-uniform light intensity; and
    means for illuminating the transfer pattern on the transmission membrane of the mask with the exposure beam for exposing the transfer pattern to transfer the transfer pattern onto a substrate.

16. An exposure apparatus according to claim 15, further comprising means for correcting variations in the intensity of the exposure beam along the predetermined direction to expose the substrate uniformly.

17. A method for manufacturing a micro-device in a lithography process, comprising the steps of:
    providing a first mask, which includes a base surface having optical non-uniformity along a first predetermined direction, and a first transfer pattern having a plurality of pattern lines in a predetermined arrangement;
    providing a second mask, which includes a base surface having optical non-uniformity along a second predetermined direction, and a second transfer pattern having a plurality of pattern lines in a predetermined arrangement;

transferring the first transfer pattern of the first mask onto a zone of a substrate by exposure with an exposure beam; and transferring the second transfer pattern of the second mask onto the same zone of the substrate by exposure with an exposure beam, wherein, in said transferring steps, the first predetermined direction of the first mask is substantially coincident with the second predetermined direction of the second mask, with respect to the substrate.

* * * * *

UNITED STATES PATENT AND TRADEMARK OFFICE
CERTIFICATE OF CORRECTION

PATENT NO. : 5,444,753
DATED : August 22, 1995
INVENTOR(S) : MASAMI HAYASHIDA, ET AL.

It is certified that error appears in the above-indentified patent and that said Letters Patent is hereby corrected as shown below:

ON THE COVER PAGE

UNDER "OTHER PUBLICATIONS"

"Patent Abstracts of Japan, Kokai No. 63-009931, vol. 12, No. 25" should read --Patent Abstracts of Japan, Kokai No. 63-009931, vol. 12, No. 215--.

IN THE ABSTRACT

Line 13, "a" should be deleted.
Line 20, "patter" should read --pattern--.

COLUMN 1:

Line 37, "mirror)" should read --mirror).--.
Line 46, "mirror)" should read --mirror).--.
Line 54, "system" should read --system.--.

UNITED STATES PATENT AND TRADEMARK OFFICE
CERTIFICATE OF CORRECTION

PATENT NO. : 5,444,753
DATED : August 22, 1995
INVENTOR(S) : MASAMI HAYASHIDA, ET AL.

It is certified that error appears in the above-indentified patent and that said Letters Patent is hereby corrected as shown below:

COLUMN 2:

Line 3, "in-the" should read --in the--.
    Line 14, "system" should read --system.--.
    Line 29, "tight" should read --light--.
    Line 60, "tile" should read --the--.
    Line 68, "self,sustained" should read --self-sustained--.

COLUMN 3:

Line 9, "gas" should read --gas,--.
    Line 36 "disposition-between" should read --disposition between--.

COLUMN 4:

Line 14, "of-the" should read --of the--.
    Line 19, "used" (first occurrence) should be deleted.

COLUMN 6:

Line 12, "a" should be deleted.
    Line 21, "a" should be deleted.
    Line 26, "K-ray" should read --X-ray--.
    Line 28, "a" should be deleted.
    Line 31, "K-ray" should read --X-ray--.

UNITED STATES PATENT AND TRADEMARK OFFICE
CERTIFICATE OF CORRECTION

PATENT NO. : 5,444,753
DATED : August 22, 1995
INVENTOR(S) : MASAMI HAYASHIDA, ET AL.

It is certified that error appears in the above-indentified patent and that said Letters Patent is hereby corrected as shown below:

COLUMN 6:

Line 34, "a" should be deleted.
    Line 42, "K-ray" should read --X-ray--.
    Line 54, "direct:ion)" should read --direction)--.
    Line 57, "to." should read --$L_o$.--.
    Line 68, "the," (second occurrence) should read --the--.

COLUMN 7:

Line 2, "214," should read --14,--.
    Line 18, "the." should read --the--.
    Line 38, "tile" should read --the--.
    Line 56, "K-ray" should read --X-ray--.
    Line 65, "15" should read --16--.

COLUMN 8:

Line 5, "forming-the" should read --forming the--.
    Line 55, "X-ray-transmission" should read --X-ray transmission--.
    Line 65, "15" should read --16--.

UNITED STATES PATENT AND TRADEMARK OFFICE
CERTIFICATE OF CORRECTION

PATENT NO. : 5,444,753
DATED : August 22, 1995
INVENTOR(S) : MASAMI HAYASHIDA, ET AL.

It is certified that error appears in the above-indentified patent and that said Letters Patent is hereby corrected as shown below:

COLUMN 9:

Line 4, "the" (first occurrence) should read --the 16--.
    Line 22, "linearly" should read --one-dimensionally--.
    Line 33, "lab" should read --16b--.
    Line 53, "tile" should read --the--.
    Line 63, "tile" should read --the--.

COLUMN 11:

Line 38, "late" should read --are--.
    Line 48, "120.A" should read --120A--.
    Line 52, "ia" should read --is--.

COLUMN 12:

Line 67, "This," should read --Thus,--.

UNITED STATES PATENT AND TRADEMARK OFFICE
CERTIFICATE OF CORRECTION

PATENT NO. : 5,444,753
DATED : August 22, 1995
INVENTOR(S) : MASAMI HAYASHIDA, ET AL.

It is certified that error appears in the above-indentified patent and that said Letters Patent is hereby corrected as shown below:

COLUMN 13:

Line 51, "mask" should read --method--.
    Line 54, "mask" should read --method--.

COLUMN 14:

Line 11, "mask" should read --method--.
    Line 14, "mask" should read --method--.

Signed and Sealed this

Thirtieth Day of January, 1996

Attest:

BRUCE LEHMAN

Attesting Officer    Commissioner of Patents and Trademarks